United States Patent
Shen et al.

(10) Patent No.: US 8,416,213 B2
(45) Date of Patent: Apr. 9, 2013

(54) SENSING APPARATUS AND ASSOCIATED SEQUENTIAL SCAN DRIVING METHOD

(75) Inventors: Yu-Tang Shen, Tainan (TW); Shao-Hsing Yeh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 815 days.

(21) Appl. No.: 12/342,258

(22) Filed: Dec. 23, 2008

(65) Prior Publication Data

US 2009/0284398 A1     Nov. 19, 2009

(30) Foreign Application Priority Data

May 14, 2008   (TW) ............................... 97117691 A

(51) Int. Cl.
*G09F 3/042* (2011.01)
*G06F 3/045* (2006.01)
*G01D 7/00* (2006.01)

(52) U.S. Cl. ................ 345/174; 178/18.05; 73/862.046
(58) Field of Classification Search .................. 345/174; 178/18.05; 73/862.046
See application file for complete search history.

(56) References Cited

U.S. PATENT DOCUMENTS

| | | | | |
|---|---|---|---|---|
| 4,374,384 A | * | 2/1983 | Moates ..................... | 340/870.38 |
| 4,734,034 A | * | 3/1988 | Maness et al. ............... | 73/865.7 |
| 4,752,694 A | * | 6/1988 | Hegel et al. ................... | 348/241 |
| 4,795,998 A | * | 1/1989 | Dunbar et al. .................. | 338/5 |
| 4,856,993 A | | 8/1989 | Maness et al. | |
| 5,237,879 A | * | 8/1993 | Speeter ................... | 73/862.041 |
| 5,505,072 A | | 4/1996 | Oreper | |
| 5,756,904 A | | 5/1998 | Oreper et al. | |
| 5,905,209 A | | 5/1999 | Oreper | |
| 5,915,285 A | | 6/1999 | Sommer | |
| 5,989,700 A | | 11/1999 | Krivopal | |
| 6,225,814 B1 | | 5/2001 | Oreper et al. | |
| 6,979,164 B2 | | 12/2005 | Kramer | |
| 7,075,316 B2 | * | 7/2006 | Umeda et al. ................. | 324/658 |

(Continued)

FOREIGN PATENT DOCUMENTS

JP    07295726 A  * 11/1995
TW    276298        8/1996

(Continued)

OTHER PUBLICATIONS

Taiwanese language office action dated May 29, 2012.

(Continued)

*Primary Examiner* — Adam J Snyder
(74) *Attorney, Agent, or Firm* — McClure, Qualey & Rodack, LLP

(57) ABSTRACT

A sensing apparatus and a scan driving method thereof are provided. The sensing apparatus includes first and second electrodes, a sensing element array, first and second electrode scan driving circuits and a control circuit. The sensing element array outputs at least one first inductive voltage after being touched. The first electrode scan driving circuit sequentially scans and drives the first electrodes, wherein the driven first electrode is set to a high level output state and the first electrode not being driven is set to a low level output state or a grounding state. The second electrode scan driving circuit sequentially scans and drives the second electrodes, wherein the driven second electrode is set to high impedance (input) state, and the second electrode not being driven is set to a low level output state or the grounding state. The control circuit controls the first and second electrode scan driving circuits.

20 Claims, 13 Drawing Sheets

U.S. PATENT DOCUMENTS

| | | | |
|---|---|---|---|
| 7,126,353 B2 * | 10/2006 | Pietsch et al. | 324/713 |
| 7,292,229 B2 | 11/2007 | Morag et al. | |
| 7,295,724 B2 | 11/2007 | Wang et al. | |
| 7,310,779 B2 | 12/2007 | Carro | |
| 7,336,078 B1 | 2/2008 | Merewether et al. | |
| 7,358,741 B2 * | 4/2008 | Sato et al. | 324/688 |
| 7,591,165 B2 * | 9/2009 | Papakostas et al. | 73/1.59 |
| 7,834,860 B2 * | 11/2010 | Muranaka | 345/173 |
| 2003/0197689 A1 * | 10/2003 | May | 345/173 |
| 2004/0140735 A1 * | 7/2004 | Scott et al. | 310/328 |
| 2005/0076824 A1 * | 4/2005 | Cross et al. | 116/205 |
| 2005/0110766 A1 * | 5/2005 | Kent et al. | 345/173 |
| 2006/0119590 A1 * | 6/2006 | Park et al. | 345/175 |
| 2007/0234825 A1 * | 10/2007 | Loomis et al. | 73/862 |
| 2007/0235231 A1 * | 10/2007 | Loomis et al. | 178/18.06 |
| 2007/0242053 A1 | 10/2007 | Muranaka | |

FOREIGN PATENT DOCUMENTS

| | | |
|---|---|---|
| TW | 286358 | 9/1996 |
| TW | 288633 | 10/1996 |
| TW | 351990 | 2/1999 |
| TW | 476694 | 2/2002 |
| TW | 478060 | 3/2002 |
| TW | 482894 | 4/2002 |
| TW | 556354 | 10/2003 |
| TW | I225219 | 12/2004 |
| TW | I236636 | 7/2005 |

OTHER PUBLICATIONS

English language translation of abstract of TW I225219 (published Dec. 11, 2004).

English abstract of TW288633, Oct. 11, 1996.

English abstract of TW351990, Feb. 1, 1999.

English abstract of TW476694, Feb. 21, 2002.

* cited by examiner

SENSING APPARATUS AND ASSOCIATED SEQUENTIAL SCAN DRIVING METHOD

This application claims the benefit of Taiwan application Serial No. 97117691, filed May 14, 2008, the subject matter of which is incorporated herein by reference.

BACKGROUND OF THE INVENTION

1. Field of the Invention

The invention relates in general to a sensor, and more particularly to a sensing apparatus and a scan driving method thereof.

2. Description of the Related Art

In recent years, touch-control function has been widely used in life. For example, the dynamic gray pressure sensor is used for home care identification, capacitive pressure sensor, directivity touch-control of panel, multi-touch and so on. Therefore, large area sensor scanning, array, three-dimensional sensing and multi-touch sensing technology will be the future trend of consumer electronics. However, it causes the sensing circuit relatively complicated. So it is a hot topic to greatly simplify architecture of scanning actuation and sensing circuit.

A dynamic response scan circuit of an array-type pressure sensing element is disclosed in FIG. 1 of U.S. Pat. No. 5,505,072. The scan circuit sequentially scan-drives column electrodes according to a current feedback signal VTEST. The signal VTEST flows through a piezoresistive sensor and voltage signals are acquired through a negative feedback amplifier. Finally, an analog-to-digital converter sequentially reads the voltage signals to build the position of the array sensing element.

An output circuit of a pressure sensing element is disclosed in FIG. 3 of U.S. Pat. No. 5,905,209. The output circuit acquires voltage signals of sensing elements by sequentially switching column electrodes according to a grounding signal GND, and then using the voltage sensing architecture of row electrodes.

SUMMARY OF THE INVENTION

The invention is directed to a sensing apparatus and a scan driving method thereof. For example, the sensing apparatus and the scan driving method are used for pressure sensing, force sensing or multi-touch. Wherein a first electrode and a second electrode are properly scan-driven via logic combinations of the high-level output, the low-level output and the high-impedance (input) of the input/output interface port (I/O Port) having the tri-state property. Thus, the sensing apparatus disclosed hereinbelow can prevent the leakage current caused in the scan-driving process from influencing the measurement and the recognition of the first inductive voltage, the multi-touch can be implemented, the ghost point phenomenon caused during touching can be solved, and the scan-driving time of the sensing apparatus can be shortened.

According to a first aspect of the present invention, a sensing apparatus is provided. The sensing apparatus includes first electrodes, second electrodes, a sensing element array, a first electrode scan driving circuit, a second electrode scan driving circuit and a control circuit. The sensing element array disposed between the first electrodes and the second electrodes outputs at least one first inductive voltage after being touched. The first electrode scan driving circuit sequentially scans and drives the first electrodes. The first electrode being driven is set to a high level output state, and the first electrode not being driven is set to a low level output state or a grounding state. The second electrode scan driving circuit sequentially scans and drives the second electrodes. The second electrode being driven is set to a high impedance input state, and the second electrode not being driven is set to the low level output state or the grounding state. The control circuit controls the first electrode scan driving circuit and the second electrode scan driving circuit.

According to a second aspect of the present invention, a scan driving method of a sensing apparatus is provided. The scan driving method includes the steps of: sequentially scanning and driving a plurality of first electrodes, wherein the first electrode being driven is set to a high level output state, and the first electrode not being driven is set to a low level output state or a grounding state; sequentially scanning and driving a plurality of second electrodes, wherein the second electrode being driven is set to a high impedance input state, and the second electrode not being driven is set to the low level output state or the grounding state; and outputting at least one first inductive voltage when a sensing element array between the first electrodes and the second electrodes is touched.

The invention will become apparent from the following detailed description of the preferred but non-limiting embodiments. The following description is made with reference to the accompanying drawings.

DETAILED DESCRIPTION OF THE INVENTION

The input/output interface port (I/O Port) with the tri-state property has three logic states of the high-level output, the low-level output and the high-impedance (input). The following embodiments sequentially scan and drive first electrodes and second electrodes through the tri-state logic combinations of the input/output interface port so that the sensing apparatus can prevent the leakage current caused in the scan-driving process from influencing the measurement and the recognition of the first inductive voltage. Thus, the multi-touch can be implemented, the ghost point phenomenon caused during touching can be solved, and the scan-driving time of the sensing apparatus can be shortened.

Figure 1:
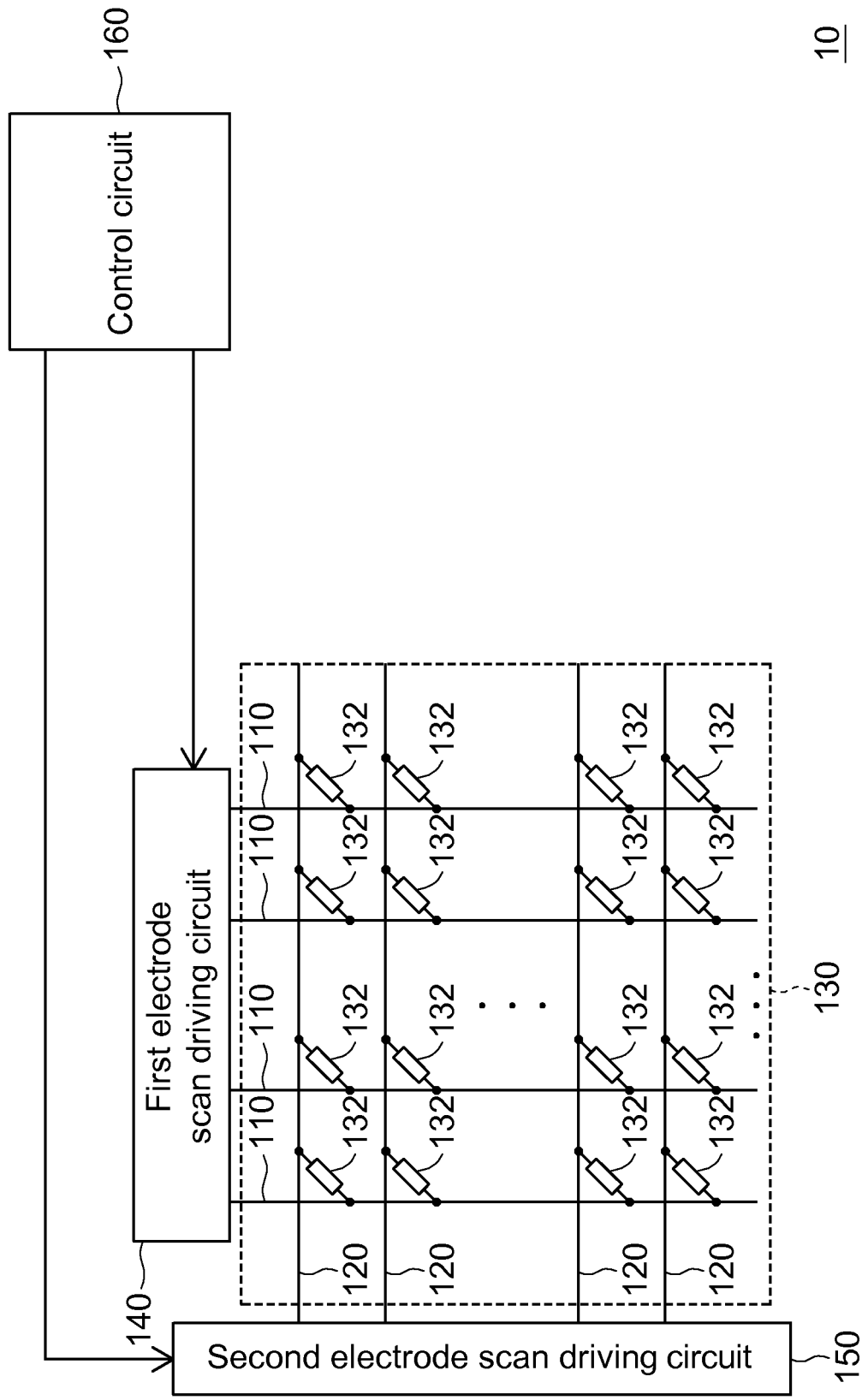
FIG. 1 is a schematic illustration showing a sensing apparatus according to an embodiment of the invention.

FIG. 1 is a schematic illustration showing a sensing apparatus 10 according to an embodiment of the invention. Referring to FIG. 1, the sensing apparatus 10 includes first electrodes 110, second electrodes 120, a sensing element array 130, a first electrode scan driving circuit 140, a second electrode scan driving circuit 150 and a control circuit 160. The control circuit 160 controls the first electrode scan driving circuit 140 and the second electrode scan driving circuit 150. The first electrode scan driving circuit 140 sequentially scans and drives the first electrodes 110, wherein the first electrode 110 being driven is set to a high level output state, and the first electrode 110 not being driven is set to a low level output state or the grounding state. The second electrode scan driving circuit 150 sequentially scans and drives the second electrodes 120, wherein the second electrode 120 being driven is set to a high impedance input state, and the second electrode 120 not being driven is set to the low level output state. The sensing element array 130 is disposed between the first electrodes 110 and the second electrodes 120, and outputs at least one first inductive voltage after being touched, pressed, forced or squeezed.

For example, the first electrode scan driving circuit 140, the second electrode scan driving circuit 150 and the control circuit 160 are implemented by a microcontroller (MCU), a field-programmable gate array (FPGA), an application specific integrated circuit (ASIC) or a system on chip (SoC). In addition, the first electrode scan driving circuit 140 and the second electrode scan driving circuit 150 may further be integrated in the control circuit 160.

The first electrodes 110 and the second electrodes 120 are respectively column electrodes and row electrodes, for example, and the first electrode scan driving circuit 140 and the second electrode scan driving circuit 150 are respectively a column electrode scan driving circuit and a row electrode scan driving circuit. In another architecture, the first electrodes 110 and the second electrodes 120 are respectively the row electrodes and the column electrodes, and the first electrode scan driving circuit 140 and the second electrode scan driving circuit 150 are respectively the row electrode driving circuit and the column electrode driving circuit, for example. The sensing element array 130 disposed between the first electrodes 110 and the second electrodes 120 further includes a sensing element 132, wherein two ends of the sensing element 132 are respectively coupled to the first electrode 110 and the second electrode 120.

The sensing element 132 may have various aspects, which are not particularly restricted in this invention. For example, the sensing element 132 may be manufactured by micro electro mechanical system (MEMS) processes or complementary metal oxide semiconductor (CMOS) processes. Alternatively, the sensing element 132 may be formed by coating the resistor material between the first electrode 110 and the second electrode 120 according to the screen-printing or printing technology. However, two aspects of the sensing element 132 for reference will be illustrated in FIGS. 2 and 3 for the sake of illustration.

Figure 2:
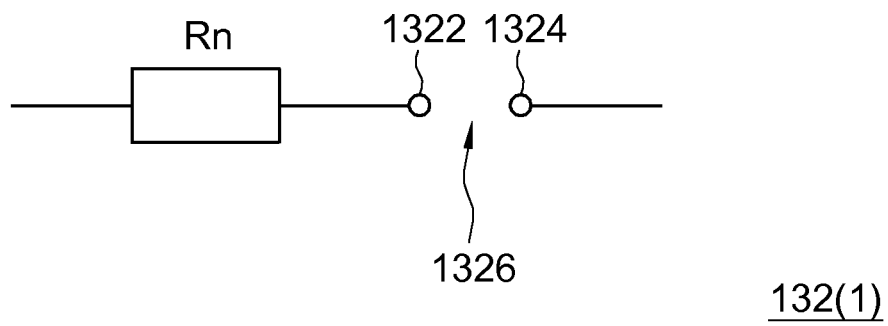
FIG. 2 is a schematic illustration showing a first sensing element suitable for use in the circuit of FIG. 1 in place of the sensing element array, which first read-out circuit is in accordance with the teachings of this invention.

FIG. 2 is a schematic illustration showing a first sensing element. The first sensing element in FIG. 2 is represented by a sensing element 132(1). The sensing element 132(1) includes a first connection point 1322, a second connection point 1324 and a resistive sensor Rn. The first connection point 1322 is electrically connected to the resistive sensor Rn. When the sensing element 132(1) is not touched, a gap 1326 or a clearance is formed between the second connection point 1324 and the first connection point 1322. When the sensing element 132(1) is touched, the first connection point 1322 direct contacts the second connection point 1324 so that the first electrode 110 is coupled to the second electrode 120 via the resistive sensor Rn and second connection point 1324.

When the sensing element 132(1) is touched, pressed, forced or squeezed by an external force, the resistance value of the resistive sensor Rn is changed. The first electrode scan driving circuit 140 and the second electrode scan driving circuit 150 respectively scan and drive the first electrodes 110 and the second electrodes 120 so that the resistance value of the forced sensing element array 130 is changed to generate a voltage change, which is referred to as a first inductive voltage.

Figure 3:
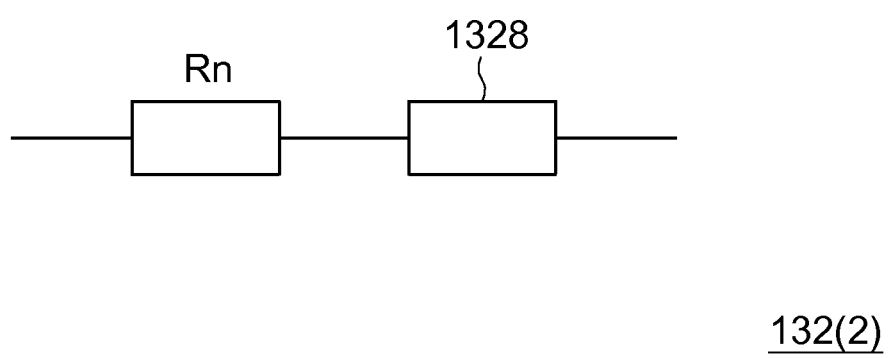
FIG. 3 is a schematic illustration showing a second sensing element suitable for use in the circuit of FIG. 1 in place of the sensing element array, which first read-out circuit is in accordance with the teachings of this invention.

FIG. 3 is a schematic illustration showing a second sensing element. The second sensing element in FIG. 3 is represented by a sensing element 132(2). The sensing element 132(2) includes a resistive sensor Rn and a switching element 1328, which may be a transistor or a diode. When the sensing element 132(2) is touched, pressed, forced or squeezed, the switching element 1328 is actuated to turn on so that the first electrode 110 is coupled to the second electrode 120 via the resistive sensor Rn series connecting with switching element 1328. Because the switching element 1328 may be a transistor or a diode, the control end of the transistor or the diode is actuated to turn on the transistor or the diode when the sensing element 132(2) is touched. Thus, the first connection point 1322 and the second connection point 1324 shown in FIG. 2 are replaced with the switching element 1328 so that the effect similar to the gap 1326 or the clearance can be achieved.

Similarly, when the sensing element 132(2) is touched, pressed, forced or squeezed by an external force, the resistance value of the resistive sensor Rn is changed. The first electrode scan driving circuit 140 and the second electrode scan driving circuit 150 respectively scan and drive the first electrodes 110 and the second electrodes 120 so that the resistance value of the forced sensing element array 130 is changed to generate a voltage change, which is referred to as a first inductive voltage.

Figure 4:
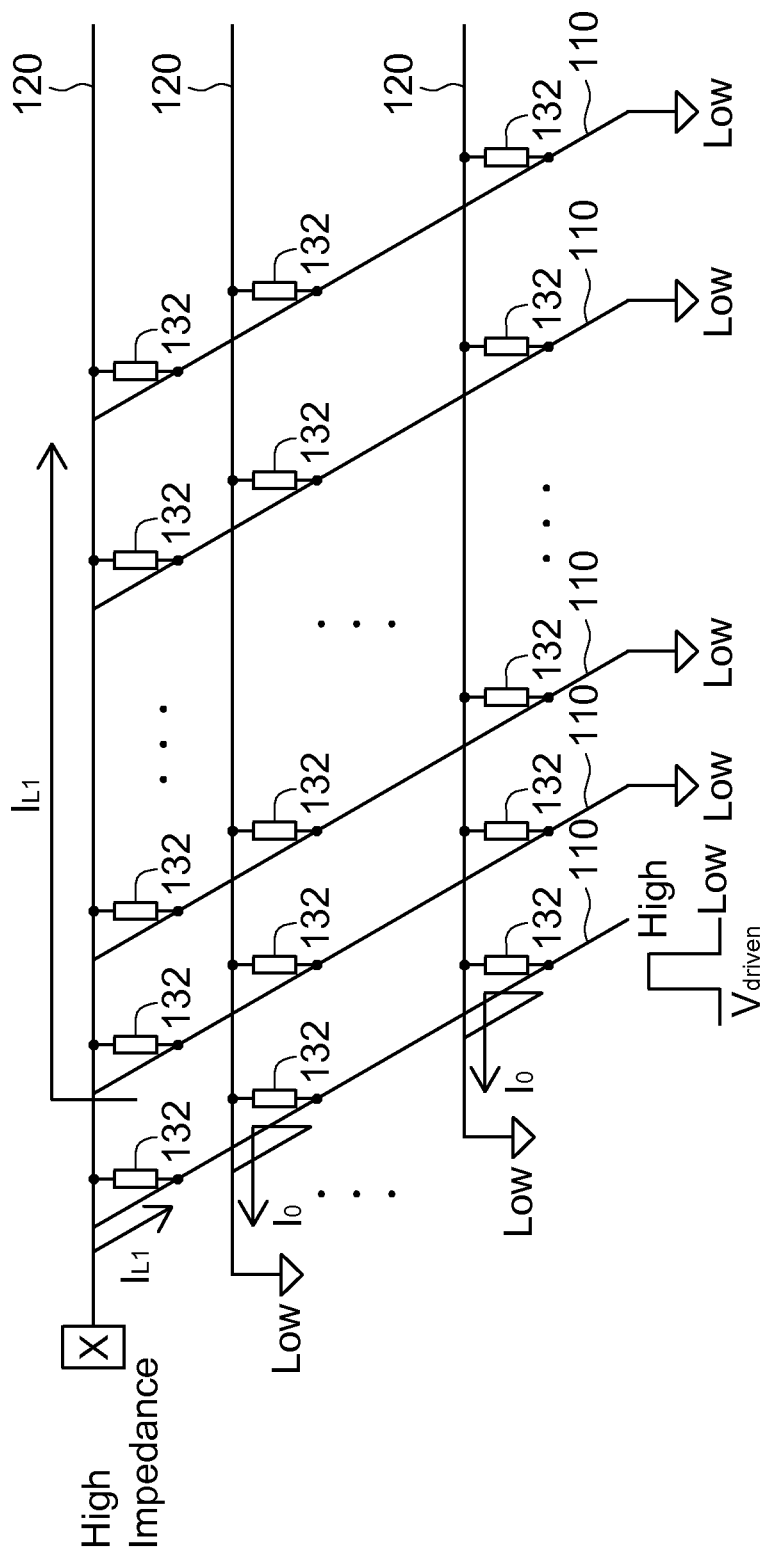
FIG. 4 is a schematic illustration showing a sensing element array 130 being scanned and driven in accordance with the teachings of this invention.

FIG. 4 illustrates an embodiment of the invention shown in FIG. 1 that is showing the sensing element array 130 being scan and driven. As shown in FIG. 4, the first electrode scan driving circuit 140 and the second electrode scan driving circuit 140 respectively sequentially scan and drive the first electrode 110 and the second electrode 120. For example, when the first electrode scan driving circuit 140 drives the first column and first row of sensing element 132, the first electrode scan driving circuit 140 outputs a driven signal $V_{driven}$ to the first electrode 110 coupled to the first column and first row of sensing element 132. Because the driven signal $V_{driven}$ is kept at the high level, the first electrode 110 being driven is set to a high level output state. Meanwhile, the first electrode scan driving circuit 140 sets the first electrode 110, which is not coupled to the first column and first row of sensing element 132, to the low level output state or a direct grounding state.

Meanwhile, the second electrode scan driving circuit 150 sets the second electrode 120, which is coupled to the first column and first row of sensing element 132, to the high impedance (input) state. The second electrode scan driving circuit 150 also sets the second electrode 120, which is not coupled to the first column and first row of sensing element 132, to the low level output state or the direct grounding state.

Consequently, when the first column and first row of sensing element 132 is driven, a leakage current $I_O$ flowing into the low level or ground through the second electrode 120, which is not coupled to the first column and first row of sensing element 132, never influences the stability and the size of a loading current $I_{L1}$ flowing through the sensing path of the first inductive voltage. So, this embodiment can prevent the leakage current $I_O$, generated during scan-driving, from influencing the measurement and the recognition of the read-out circuit on the first inductive voltage, and can simultaneously solve the ghost point phenomenon caused during touching. The read-out circuit or control circuit will be described in detail in the following with reference to FIGS. 5 to 11.

Figure 5:
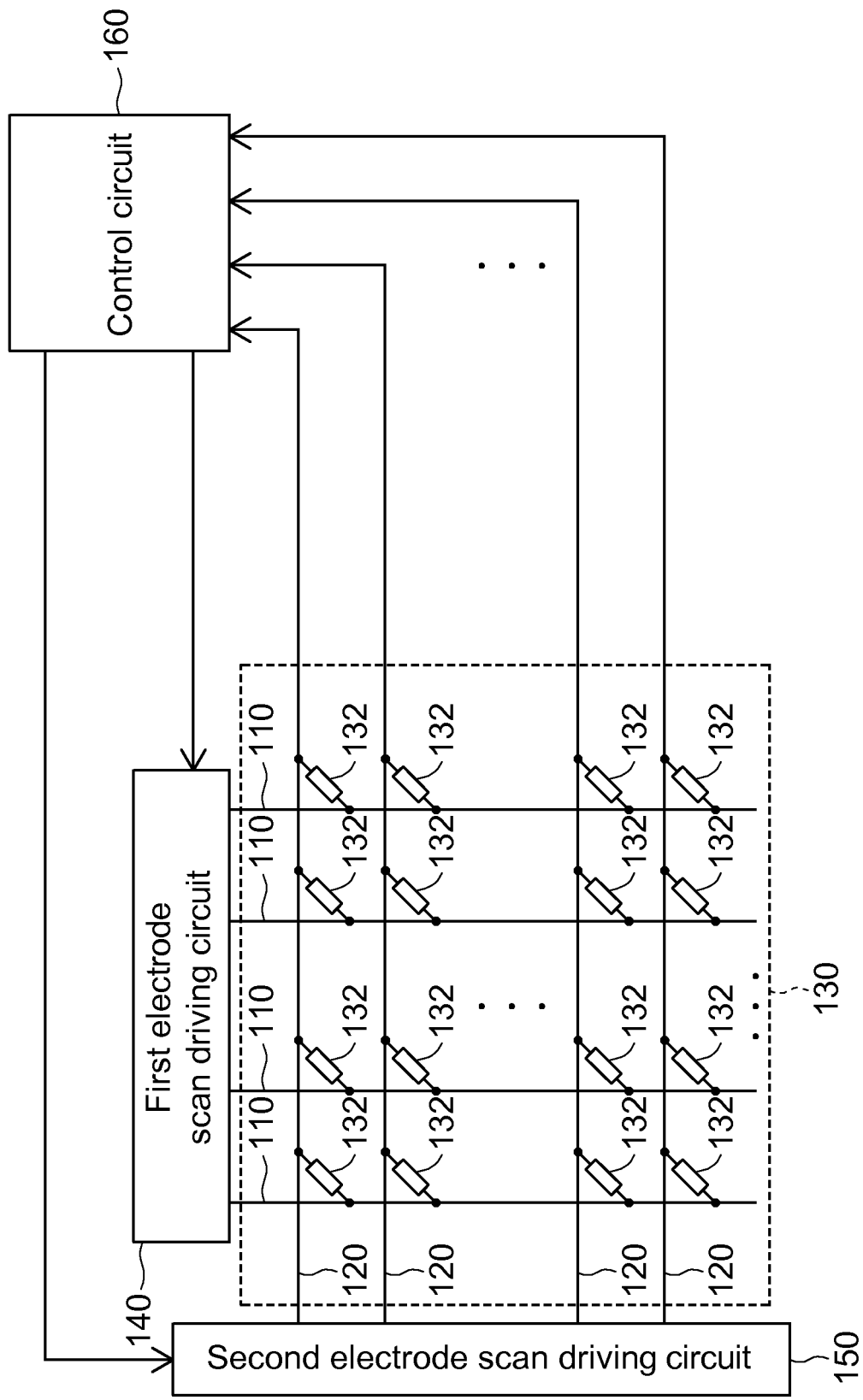
FIG. 5 is a first schematic illustration showing the sensing element array for outputting a first inductive voltage.

FIG. 5 is a first schematic illustration showing the sensing element array for outputting the first inductive voltage. The read-out circuit may directly electrically connect the second electrode 120 to an analog-to-digital converter disposed inside the control circuit 160. That is, the second electrode 120 may be directly coupled to the control circuit 160. The control circuit 160 receives the first inductive voltage, generated after the sensing element array 130 is touched, pressed, forced or squeezed, via the second electrode 120.

Figure 6:
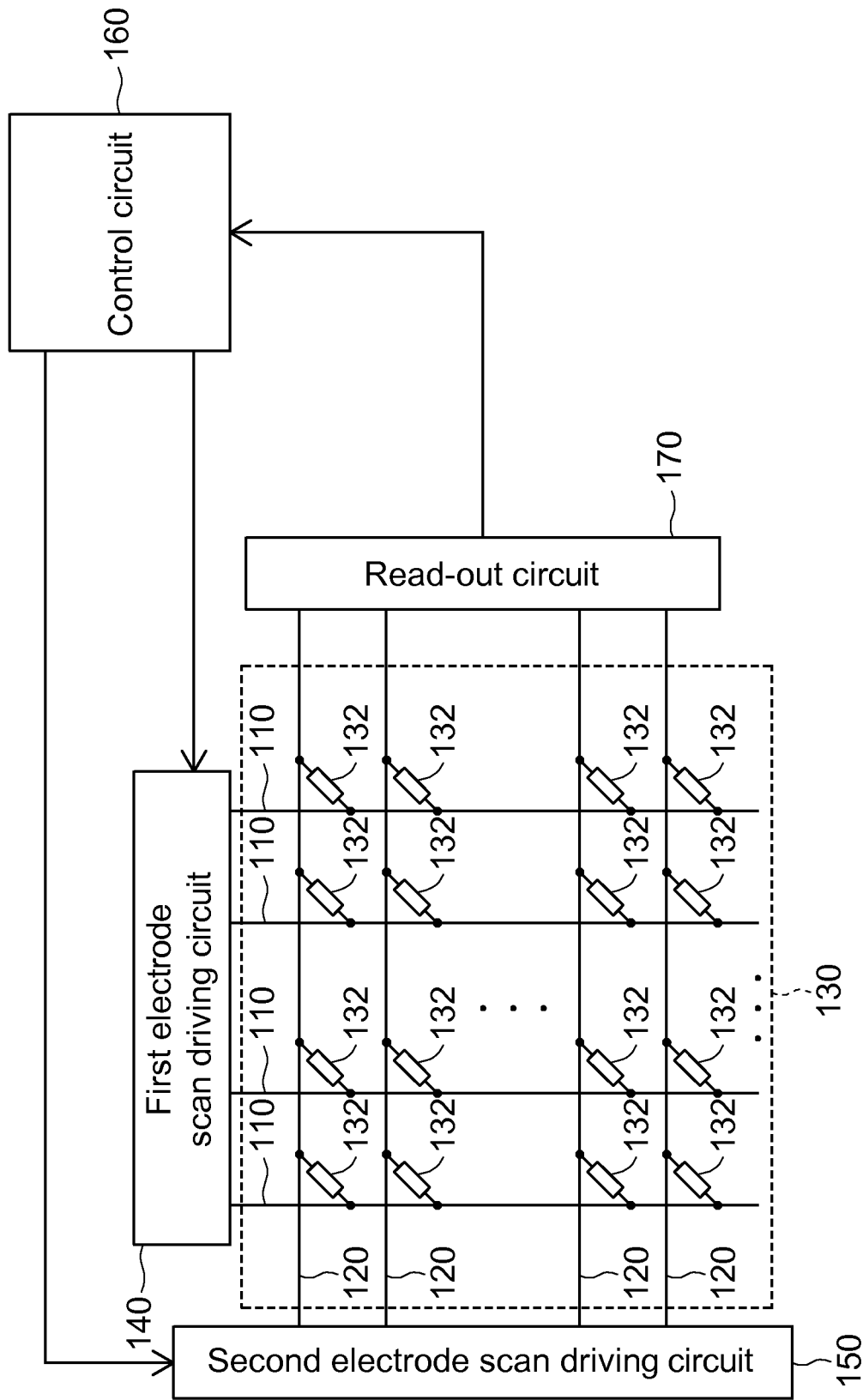
FIG. 6 is a second schematic illustration showing the sensing element array for outputting the first inductive voltage.

FIG. 6 is a second schematic illustration showing the sensing element array for outputting the first inductive voltage. Alternatively, a read-out circuit 170 is disposed between the second electrodes 120 and the control circuit 160. The read-out circuit 170 measures the first inductive voltage generated after the sensing element array 130 is touched, pressed, forced or squeezed.

The read-out circuit 170 may have various aspects, which are not particularly restricted in this invention. Nevertheless, three different aspects of the read-out circuit 170 will be described with reference to FIGS. 7 to 9 for the sake of illustration.

Figure 7:
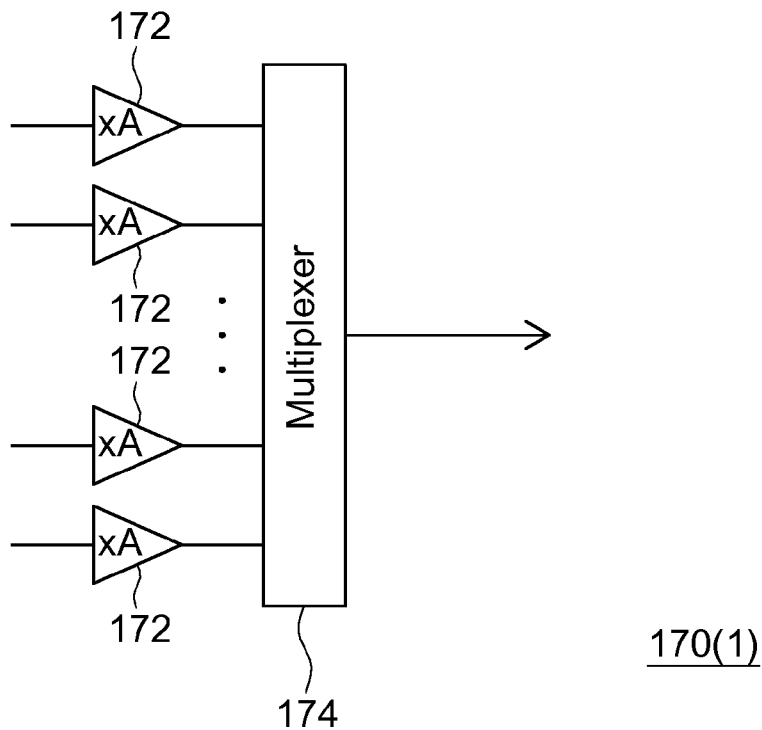
FIG. 7 is a schematic illustration showing a first read-out circuit suitable for use in the circuit of FIG. 6, which first read-out circuit is in accordance with the teachings of this invention.

FIG. 7 is a schematic illustration showing a first type of read-out circuit. The first read-out circuit is represented by a read-out circuit 170(1) in FIG. 7. The read-out circuit 170(1) includes many amplifiers 172 and a multiplexer 174. The amplifiers 172 are respectively coupled to the second electrodes 120. The first inductive voltage is amplified by the amplifiers 172 into a second inductive voltage, which is then outputted. The multiplexer selectively outputs the second inductive voltage from the amplifiers 172 to the control circuit 160.

Figure 8:
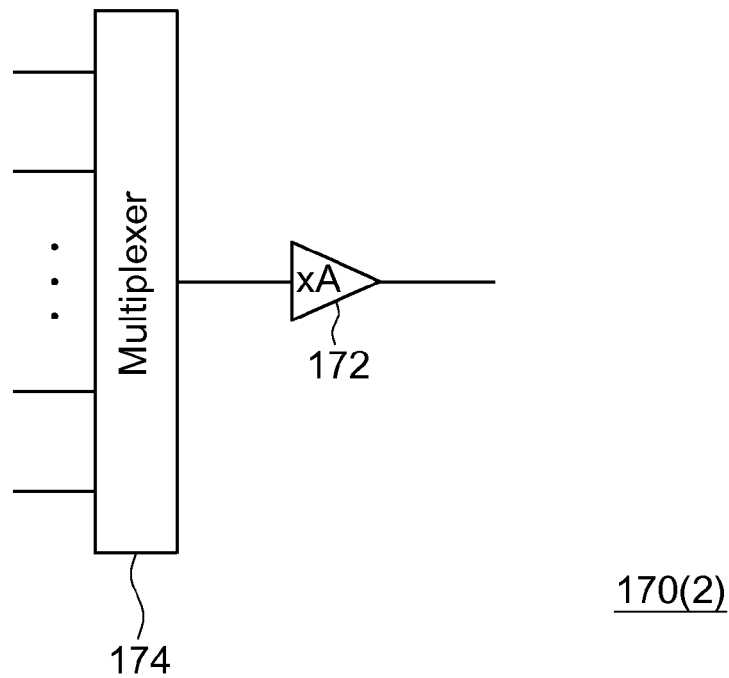
FIG. 8 is a schematic illustration showing a second read-out circuit suitable for use in the circuit of FIG. 6, which first read-out circuit is in accordance with the teachings of this invention.

FIG. 8 is a schematic illustration showing a second type of read-out circuit. The second read-out circuit is represented by a read-out circuit 170(2) in FIG. 8. The read-out circuit 170(2) includes an amplifier 172 and a multiplexer 174. The control circuit 160 is selectively electrically connected to one of the second electrodes 120 via the multiplexer 174 so that the multiplexer 174 selectively outputs the first inductive voltage from the second electrodes 120 to the amplifier 172. The amplifier 172 amplifies the first inductive voltage into the second inductive voltage, and outputs the second inductive voltage to the control circuit 160.

Figure 9:
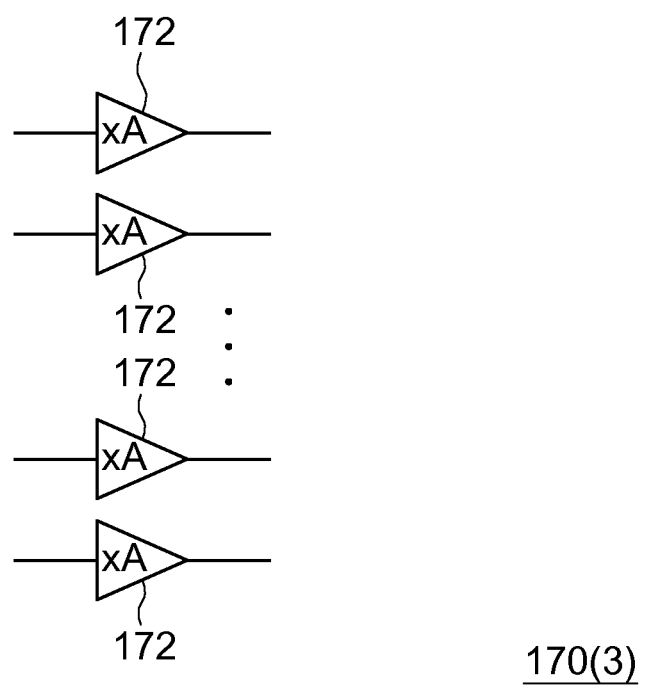
FIG. 9 is a schematic illustration showing a third read-out circuit suitable for use in the circuit of FIG. 6, which first read-out circuit is in accordance with the teachings of this invention.

FIG. 9 is a schematic illustration showing a third type of read-out circuit. The third read-out circuit is represented by a read-out circuit 170(3) in FIG. 9. The read-out circuit 170(3) includes many amplifiers 172. One of the amplifiers 172 amplifies the first inductive voltage into the second inductive voltage, which is directly outputted to the control circuit 160.

Figure 10:
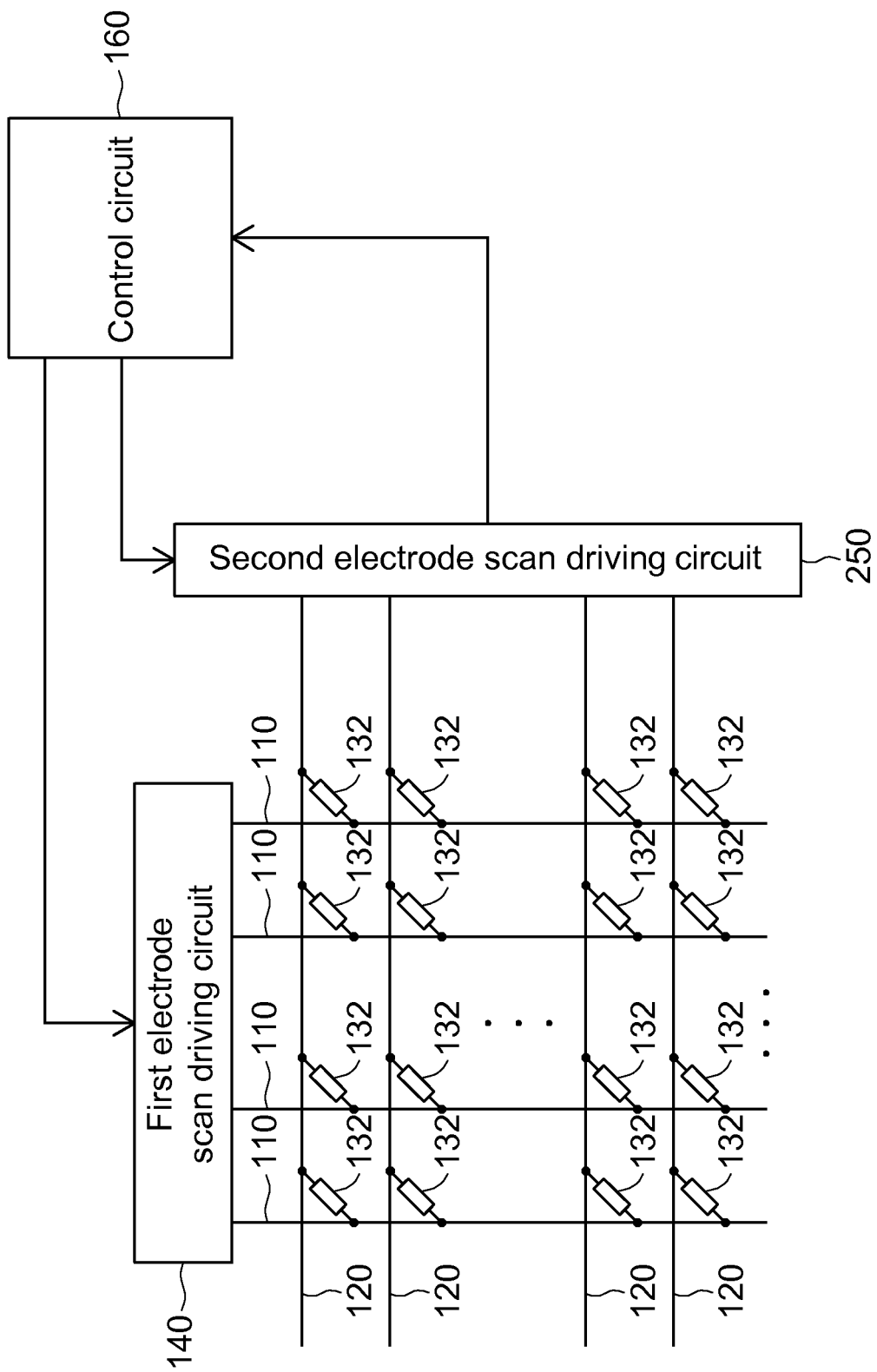
FIG. 10 is a first schematic illustration showing the read-out circuit being integrated in a second electrode scan driving circuit.

FIG. 10 is a first schematic illustration showing the read-out circuit being integrated in the second electrode scan driving circuit. As shown in FIG. 10, the read-out circuit 170 may be further integrated in the second electrode scan driving circuit 150, which is represented by a second electrode scan driving circuit 250 in FIG. 10. At this time, the second electrode scan driving circuit 250 can scan and drive the second electrodes 120 and also measure the first inductive voltage.

Figure 11:
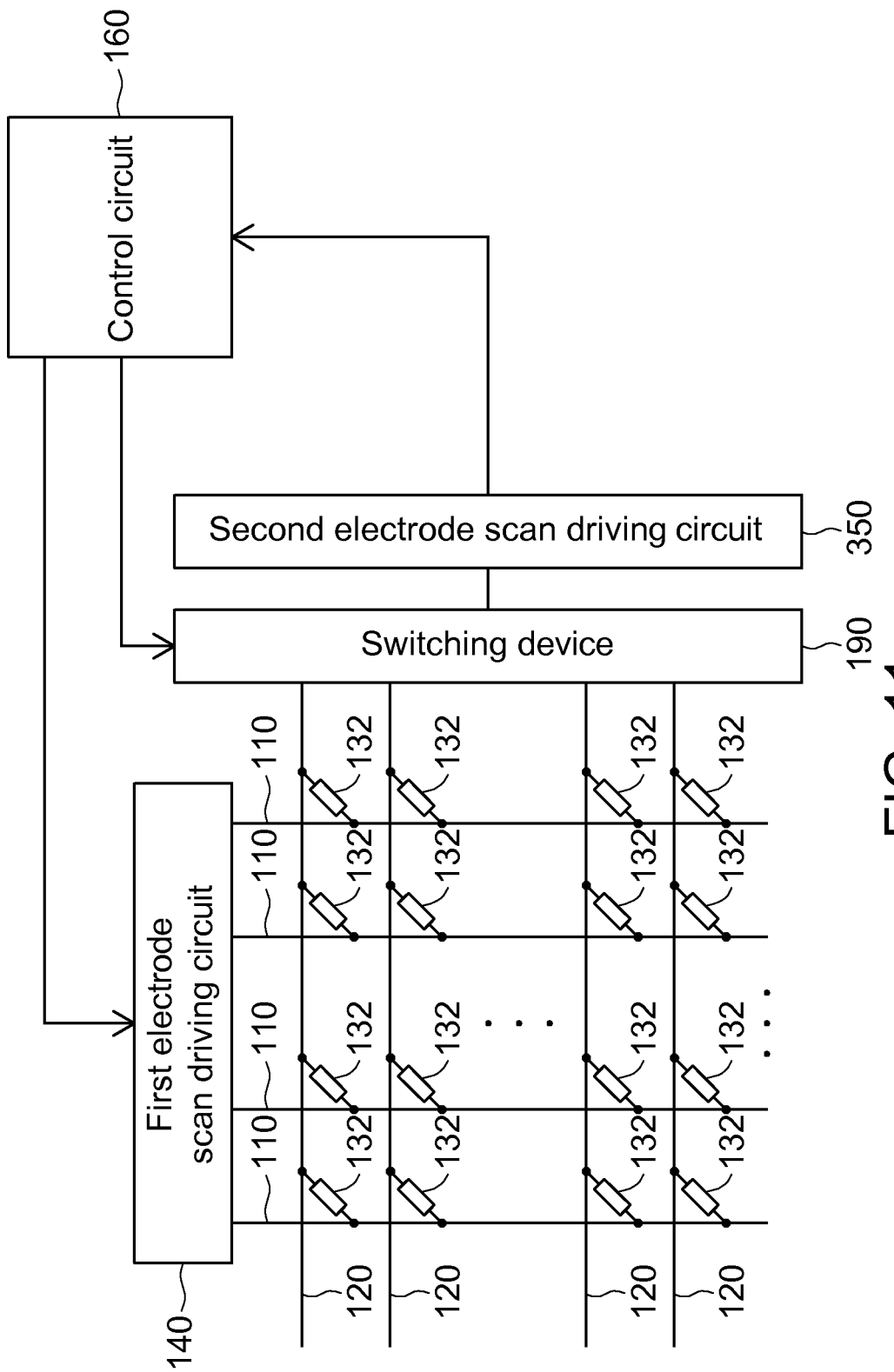
FIG. 11 is a second schematic illustration showing the read-out circuit being integrated in the second electrode scan driving circuit.

FIG. 11 is a second schematic illustration showing the read-out circuit being integrated in the second electrode scan driving circuit. In addition, in order to decrease the number of occupied input/output interface ports (I/O Ports) in the control circuit 160, the sensing apparatus 10 further includes a many-to-one switching device 190. The second electrodes 120 are electrically connected to a single amplifier via the many-to-one switching device 190 so that the number of the occupied input/output interface ports in the control circuit 160 can be decreased.

Figure 12:
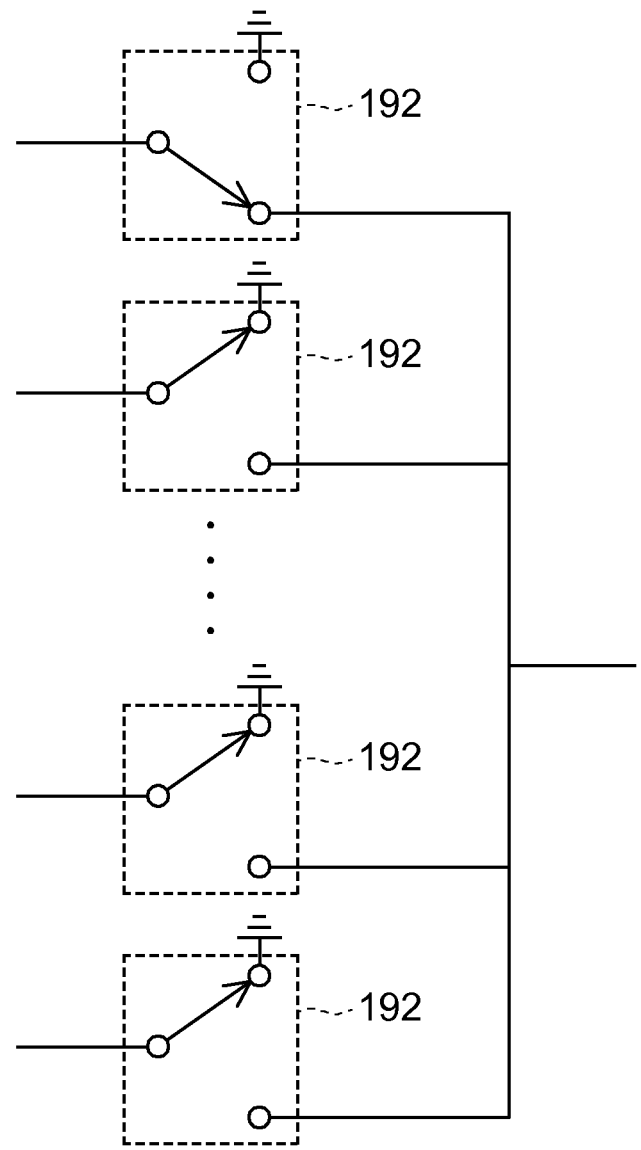
FIG. 12 is a schematic illustration showing the switch device 190 suitable for use in the circuit of FIG. 11.

FIG. 12 is a schematic illustration showing the switching device 190. Referring to FIG. 12, the switching device 190 includes many switches 192 for selectively electrically connecting the corresponding second electrodes 120 to a second electrode scan driving circuit 350 or the ground. For example, if the control circuit 160 outputs a control signal via four pins, it can control sixteen input/output interface ports by switches 192. Thus, the number of occupied input/output interface ports in the control circuit 160 can be further effectively decreased.

Figure 13:
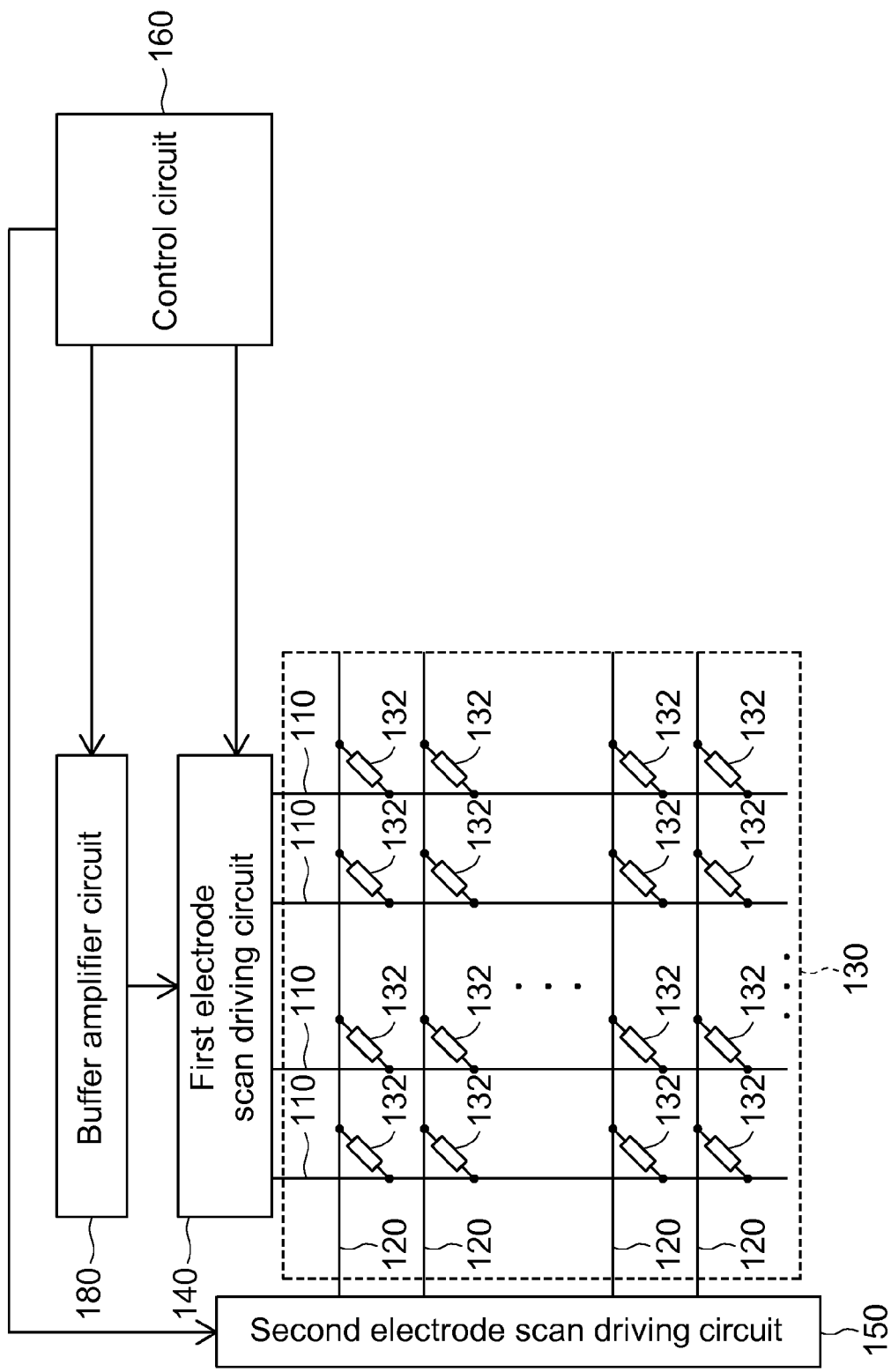
FIG. 13 is a first schematic illustration showing a sensing apparatus with buffering and amplifying functions.

FIG. 13 is a first schematic illustration showing a sensing apparatus with buffering and amplifying functions. In order to decrease the loading effect caused when the sensing element array 130 is touched, pressed, forced or squeezed, the sensing apparatus 10 of this embodiment further includes a buffer amplifier circuit 180, which enhances the scanning stability and the driving ability of the driving current of the sensing element array 130 to prevent the driving current from drifting or becoming unstable due to the load fluctuation of the resistor of the sensing element array 130 during the scan-driving process.

Figure 14:
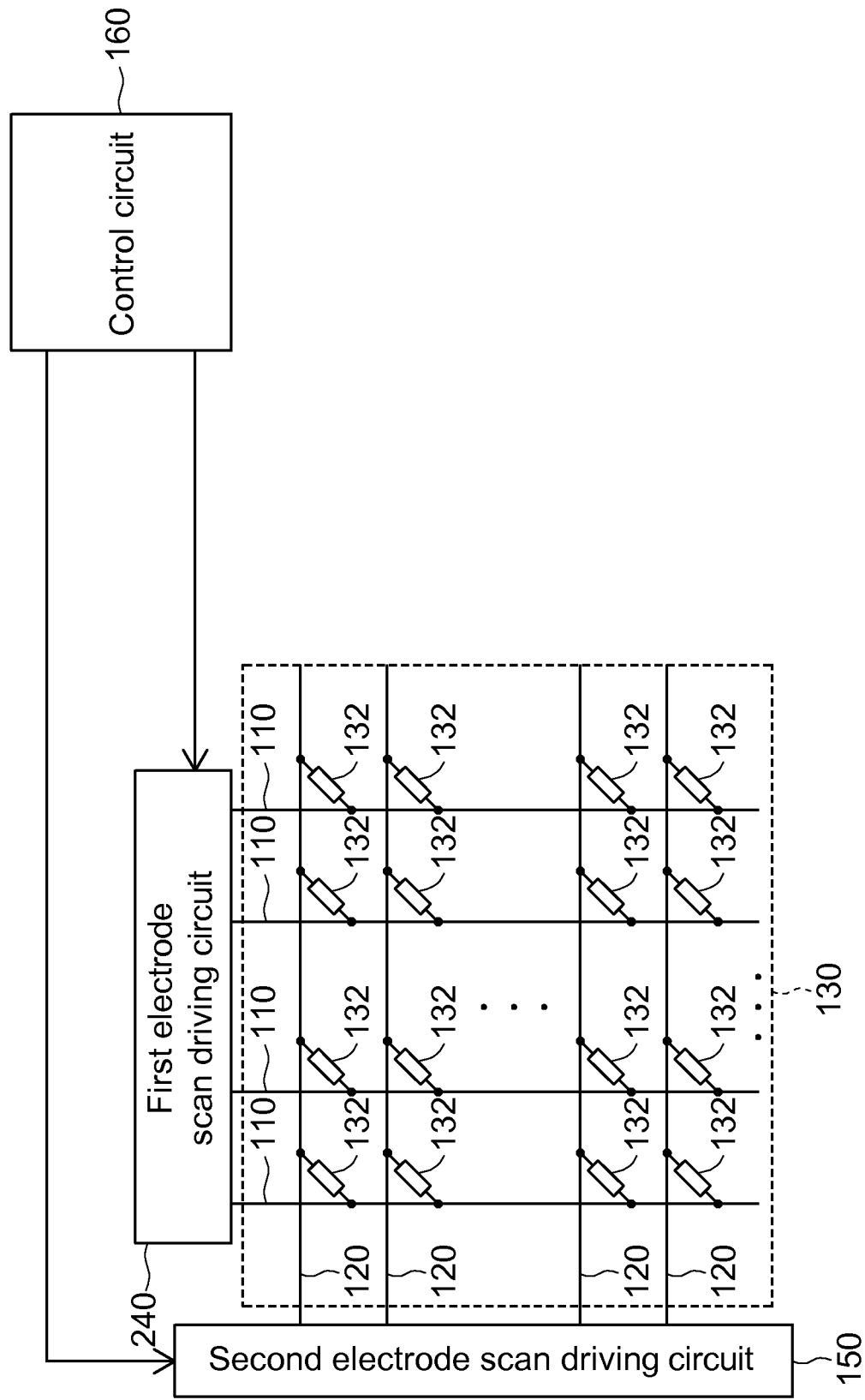
FIG. 14 is a second schematic illustration showing the sensing apparatus with buffering and amplifying functions.

FIG. 14 is a second schematic illustration showing the sensing apparatus with buffering and amplifying functions. Alternatively, the buffer amplifier circuit 180 is integrated into the first electrode scan driving circuit 140, which is represented by a first electrode scan driving circuit 240 in FIG. 14. The first electrode scan driving circuit 240 can scan and drive the first electrodes 110, and also with buffering and amplifying functions to enhance the scanning stability and the driving ability of the driving current of the sensing element array 130 to prevent the driving current from drifting or becoming unstable due to the load fluctuation of the resistor of the sensing element array 130 during the scan-driving process.

In the sensing apparatus, the read-out circuit 170 synchronously senses the first inductive voltage when the first electrode scan driving circuit 140 and the second electrode scan driving circuit 150 respectively sequentially drive the first electrodes 110 and the second electrodes 120. So, this embodiment can implement the multi-touch.

Figure 15:
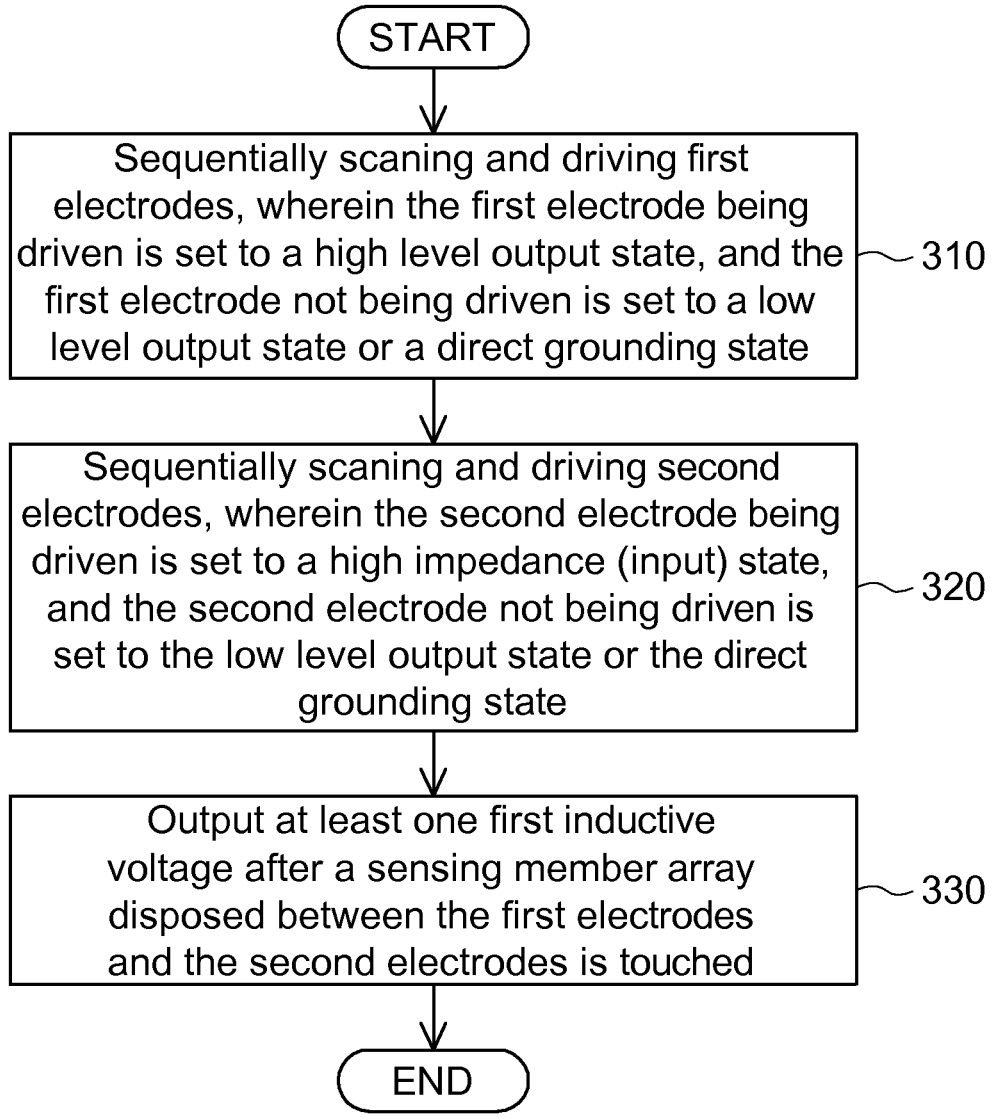
FIG. 15 is a flow chart showing a scan driving method of a sensing apparatus according to one embodiment of the invention.

FIG. 15 is a flow chart showing a scan driving method of a sensing apparatus according to one embodiment of the invention. The scan driving method may be applied to the sensing apparatus of this embodiment. The scan driving method of the invention includes the following steps.

As shown in step 310, the first electrode scan driving circuit 140 sequentially scans and drives the first electrodes 110, wherein the first electrode 110 being driven is set to a high level output state, and the first electrode 110 not being driven is set to a low level output state or the direct grounding state.

As shown in step 320, the second electrode scan driving circuit 150 sequentially drives the second electrodes 120, wherein the second electrode 120 being driven is set to a high impedance (input) state, and the second electrode 120 not being driven is set to the low level output state or the direct grounding state.

As shown in step 330, at least one first inductive voltage is outputted after the sensing element array 130 disposed between the first electrodes 110 and the second electrodes 120 is touched.

The steps 310 to 330 may be repeatedly performed so that the corresponding first inductive voltage can be outputted after the sensing element array 130 is touched, pressed, forced or squeezed.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resistive sensing apparatus, comprising:
   a plurality of first electrodes;
   a plurality of second electrodes;
   a sensing element array, disposed between the first electrodes and the second electrodes, for outputting at least one first inductive voltage after being touched;
   a first electrode scan driving circuit for sequentially scanning and driving the first electrodes, wherein the first electrode being driven is set to a constant high level output state, and the first electrode not being driven is set to a constant low level output state or a grounding state;
   a second electrode scan driving circuit for sequentially scanning and driving the second electrodes, wherein the second electrode being driven is set to a high impedance input state, and the second electrode not being driven is set to the constant low level output state or the grounding state; and
   a control circuit for controlling scan driving methods of the first electrode scan driving circuit and the second electrode scan driving circuit, wherein the at least one first inductive voltage changes when the first and second electrodes are scanned.

2. The resistive sensing apparatus according to claim 1, wherein the sensing element array includes a plurality of sensing elements each comprising:
   a resistive sensor;
   a first connection point electrically connected to the resistive sensor; and
   a second connection point, wherein a gap or a clearance is formed between the second connection point and the first connection point when the sensing element is not touched, and the first connection point contacts the second connection point so that the first electrode is coupled to the second electrode via the resistive sensor when the sensing element is touched.

3. The resistive sensing apparatus according to claim 1, wherein the sensing element array comprises a plurality of sensing elements each comprising:
   a resistive sensor; and
   a switching element, which is turned on when the sensing element is touched such that the first electrode is coupled to the second electrode via the resistive sensor.

4. The resistive sensing apparatus according to claim 3, wherein the switching element is a transistor.

5. The resistive sensing apparatus according to claim 3, wherein the switching element is a diode.

6. The resistive sensing apparatus according to claim 1, wherein the second electrodes is coupled to the control circuit.

7. The resistive sensing apparatus according to claim 1, further comprising:
   a read-out circuit for measuring the first inductive voltage.

8. The resistive sensing apparatus according to claim 7, wherein the read-out circuit comprises:
   a plurality of amplifiers, wherein one of the amplifiers amplifies the first inductive voltage into a second inductive voltage; and
   a multiplexer for selectively outputting the second inductive voltage from the amplifiers to the control circuit.

9. The resistive sensing apparatus according to claim 7, wherein the read-out circuit comprises:
   a multiplexer for selectively outputting the first inductive voltage from the second electrodes; and
   an amplifier for amplifying the first inductive voltage into a second inductive voltage and outputting the second inductive voltage to the control circuit.

10. The resistive sensing apparatus according to claim 7, wherein the read-out circuit comprises:
    a plurality of amplifiers, wherein one of the amplifiers amplifies the first inductive voltage into a second inductive voltage, and outputs the second inductive voltage to the control circuit.

11. The resistive sensing apparatus according to claim 7, wherein the read-out circuit is integrated in the second electrode scan driving circuit.

12. The resistive sensing apparatus according to claim 11, further comprising a switching device coupled between the second electrodes and the second electrode scan driving circuit.

13. The resistive sensing apparatus according to claim 12, wherein the switching device comprises a plurality of switches, each of which selectively electrically connects the corresponding second electrode to the second electrode scan driving circuit or a ground.

14. The resistive sensing apparatus according to claim 1, further comprising:
    a buffer amplifier circuit for increasing a driving current for driving the sensing element array.

15. The resistive sensing apparatus according to claim 14, wherein the buffer amplifier circuit is integrated in the first electrode scan driving circuit.

16. The resistive sensing apparatus according to claim 14, wherein the first electrode scan driving circuit and the second electrode scan driving circuit are integrated in the control circuit.

17. A scan driving method of a resistive sensing apparatus, the method comprising:
    sequentially scanning and driving a plurality of first electrodes, wherein the first electrode being driven is set to a constant high level output state, and the first electrode not being driven is set to a constant low level output state or a grounding state;

sequentially scanning and driving a plurality of second electrodes, wherein the second electrode being driven is set to a high impedance (input) state, and the second electrode not being driven is set to the constant low level output state or the grounding state; and outputting at least one first inductive voltage when a sensing element array between the first electrodes and the second electrodes is touched, wherein the at least one first inductive voltage changes when the first and second electrodes are scanned.

18. The method according to claim 17, further comprising: measuring the first inductive voltage.

19. The method according to claim 17, further comprising: amplifying the first inductive voltage into a second inductive voltage.

20. The method according to claim 17, further comprising: increasing a driving current for driving the sensing element array.

\* \* \* \* \*